(12) United States Patent
Takahashi et al.

(10) Patent No.: US 12,119,460 B2
(45) Date of Patent: Oct. 15, 2024

(54) VEHICULAR BATTERY WIRING MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Hideo Takahashi, Mie (JP); Shinichi Takase, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 518 days.

(21) Appl. No.: 17/436,724

(22) PCT Filed: Mar. 10, 2020

(86) PCT No.: PCT/JP2020/010315
§ 371 (c)(1),
(2) Date: Sep. 7, 2021

(87) PCT Pub. No.: WO2020/184564
PCT Pub. Date: Sep. 17, 2020

(65) Prior Publication Data
US 2022/0190392 A1    Jun. 16, 2022

(30) Foreign Application Priority Data

Mar. 13, 2019   (JP) .................................. 2019-045755

(51) Int. Cl.
*H01M 10/48* (2006.01)
*B60R 16/02* (2006.01)
(Continued)

(52) U.S. Cl.
CPC ....... *H01M 10/425* (2013.01); *B60R 16/0207* (2013.01); *H01M 10/482* (2013.01);
(Continued)

(58) Field of Classification Search
CPC .......................... H01M 10/425; H01M 10/482
See application file for complete search history.

(56) References Cited

U.S. PATENT DOCUMENTS

| 7,473,852 B2 | 1/2009 | Higashiguchi et al. |
| 10,644,292 B2 | 5/2020 | Takase et al. |

(Continued)

FOREIGN PATENT DOCUMENTS

| CN | 107851754 | 3/2018 |
| JP | 2000-277564 | 10/2000 |

(Continued)

OTHER PUBLICATIONS

International Search Report issued in International Patent Application No. PCT/JP2020/010315, dated Jun. 2, 2020, along with an English translation thereof.

*Primary Examiner* — Olatunji A Godo
(74) *Attorney, Agent, or Firm* — Greenblum & Bernstein, P.L.C.

(57) ABSTRACT

A flexible printed circuit board including an electronic component includes a flexible printed circuit board, an electronic component, a cover, and a restricting portion. The printed circuit board including an electrically conductive line. The electronic component is mounted on the flexible printed circuit board and joined to the electrically conductive line. The cover covers a joint between the electronic component and the electrically conductive line. The restricting portion is along an outer edge of the cover. The flexible printed circuit board includes a groove along the outer edge of the cover. The groove is defined by opposed groove side (Continued)

surfaces. One of the opposed groove side surfaces farther from the electronic component is defined as the restricting portion.

7 Claims, 9 Drawing Sheets

(51) Int. Cl.
*H01M 10/42* (2006.01)
*H05K 1/02* (2006.01)
*H05K 3/28* (2006.01)

(52) U.S. Cl.
CPC .............. *H05K 1/028* (2013.01); *H05K 3/28* (2013.01); *H01M 2200/103* (2013.01); *H01M 2220/20* (2013.01); *H05K 2201/10621* (2013.01)

(56) References Cited

U.S. PATENT DOCUMENTS

| | | |
|---|---|---|
| 2006/0154533 A1 | 7/2006 | Higashiguchi et al. |
| 2006/0266545 A1 | 11/2006 | Takeuchi et al. |
| 2011/0248719 A1 | 10/2011 | Aoki |
| 2015/0016072 A1 | 1/2015 | Iwayama et al. |
| 2017/0094790 A1* | 3/2017 | Tazarine ................ F02N 11/087 |
| 2018/0219204 A1 | 8/2018 | Takase et al. |
| 2019/0013657 A1* | 1/2019 | Doi ....................... H01B 7/0045 |

FOREIGN PATENT DOCUMENTS

| | | |
|---|---|---|
| JP | 2003-022509 | 1/2003 |
| JP | 2006-100675 | 4/2006 |
| JP | 3828917 | 10/2006 |
| JP | 2009-043765 | 2/2009 |
| JP | 2011-222285 | 11/2011 |
| JP | 2012-156389 | 8/2012 |
| JP | 2013-131714 | 7/2013 |
| JP | 2017-027831 | 2/2017 |
| JP | 2019-12614 | 1/2019 |

* cited by examiner

VEHICULAR BATTERY WIRING MODULE

TECHNICAL FIELD

The technology described herein relates to a vehicular battery wiring module.

BACKGROUND ART

A battery module for an electric vehicle or a hybrid electric vehicle includes multiple single cells that are arranged side by side and connected for increasing an output. Terminals of the adjacent single cells are connected to each other by connecting member such as busbars so that the single cells are connected in series or in parallel.

Voltage sensing lines are attached to the connecting member, respectively, for sensing voltages of the single cells. A battery wiring module includes the connecting members and the voltage sensing lines (corresponding to wiring).

A flexible printed circuit board (FPC) includes voltage sensing lines to which an electronic component such as a current limiter may be connected.

When the vehicle is subjected to high humidity, condensation may occur on the FPC included in the battery wiring module. Water droplets that may be developed by the condensation may cause a short-circuit in the electronic component. A method to reduce such a problem by covering the electronic component with an insulating resin is known (see Patent Document 1).

RELATED ART DOCUMENT

Patent Document

[Patent Document 1]
Japanese Unexamined Patent Application Publication No. 2017-27831

SUMMARY OF THE INVENTION

Problem to be Solved by the Invention

During covering of the electronic component, the insulating resin may flow out and thus the insulating resin may not be formed in a proper shape. In this case, stable protection of the electronic component from the water droplets may not be achieved. An object of the technology described herein is for restricting overflow of an insulating resin and stably shaping the insulating resin.

Means for Solving the Problem

A flexible printed circuit board including an electronic component described herein includes a flexible printed circuit board, an electronic component, a cover, and a restricting portion. The flexible printed circuit board includes an electrically conductive line. The electronic component is mounted on the printed circuit board and joined to the electrically conductive line. The cover covers a joint between the electronic component and the electrically conductive line. The restricting portion is along an outer edge of the cover. The flexible printed circuit board includes a groove along the outer edge of the cover. The groove is defined by opposed groove side surfaces. One of the opposed groove side surfaces farther from the electronic component is defined as the restricting portion.

Advantageous Effects of Invention

According to the flexible printed circuit board including the electronic component described herein, the outer edge of the cover is defined by the restricting portion. The overflow of the insulating resin is restricted and thus the insulating resin is stably shaped. Therefore, the protective effect of the insulating resin can be stably exerted.

MODES FOR CARRYING OUT THE INVENTION

Brief Description of an Embodiment

Figure 1:
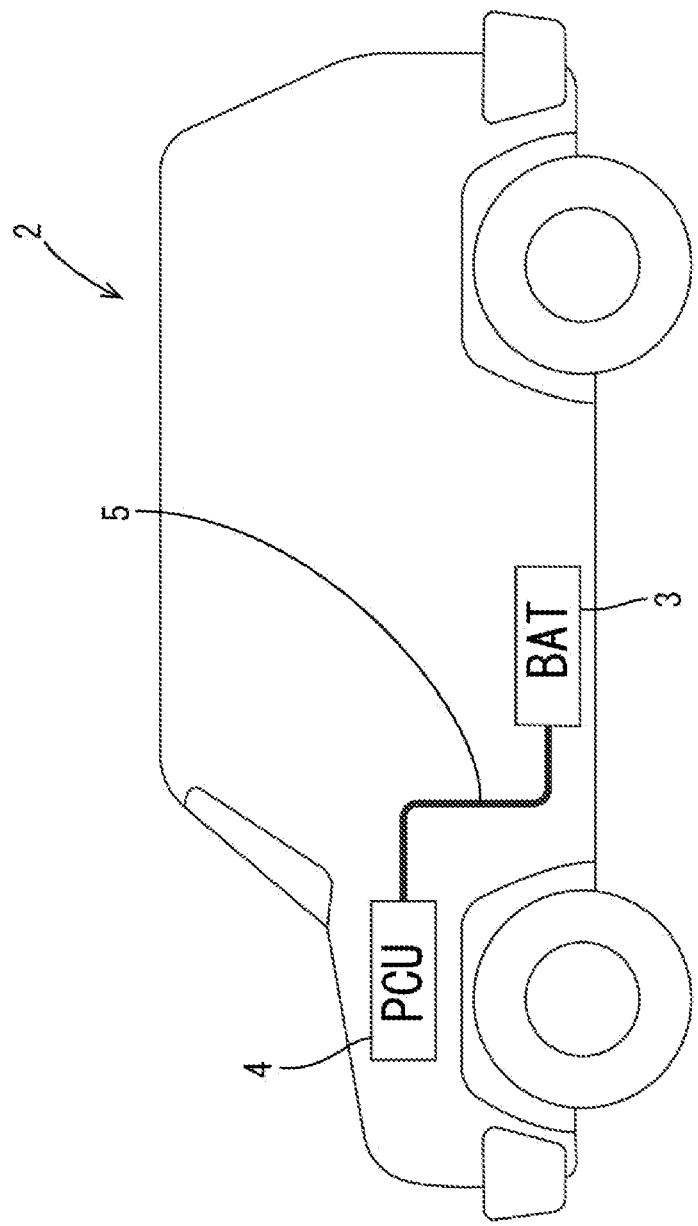
FIG. 1 is a schematic view illustrating of a vehicle on which an FPC including a current limiter according to a first embodiment is installed.

A flexible printed circuit board including an electronic component according to the technology described herein includes a flexible printed circuit board, an electronic component, a cover, and a restricting portion. The flexible printed circuit board includes an electrically conductive line. The electronic component is mounted on the flexible printed circuit board and joined to the electrically conductive line. The cover covers a joint between the electronic component and the electrically conductive line. The restricting portion is along an outer edge of the cover. The flexible printed circuit board includes a groove along the outer edge of the cover. The groove is defined by opposed groove side surfaces. One of the opposed groove side surfaces farther from the electronic component is defined as the restricting portion.

According to the configuration, the outer edge of the cover is defined by the restricting portion. This restricts overflow of insulting resin and thus the insulating resin is stably shaped. Therefore, the insulating resin can stably exert a protective function.

According to the configuration, the flexible printed circuit board includes the groove along the outer edge of the cover. The groove is defined by the opposed groove side surfaces. One of the opposed groove side surfaces farther from the electronic component is defined as the restricting portion. Therefore, the overflow of the insulating resin is restricted by the groove, that is, with a simple configuration, and the insulating resin can be stably shaped.

In the configuration, the cover may include a section disposed in the groove. According to the configuration, the groove is filled with the insulating resin and thus the insulating resin is more stably shaped.

A flexible printed circuit board including an electronic component described herein includes a flexible printed circuit board, an electronic component, a cover, and a restricting portion. The flexible printed circuit board includes an electrically conductive line. The electronic component is mounted on the flexible printed circuit board and joined to the electrically conductive line. The cover covers a joint between the electronic component and the electrically conductive line. The restricting portion is along an outer edge of the cover. The flexible printed circuit board includes a restricting protrusion that protrudes from a surface greater than other portions. The restricting protrusion is defined as the restricting portion.

With the restricting protrusion on the flexible printed circuit board defined as the restricting portion, the overflow of the insulating resin is restricted with a simple configuration, and the insulating resin can be stably shaped.

In the configuration, the flexible printed circuit board may include a base film, a restricting line, and a cover film. The electrically conductive line and the restricting line may overlap the base film from above. The cover film may cover the electrically conductive line and the restricting line. With the cover film placed over the restricting line, a multilayer structure including the restricting line and the cover film may be provided and the multilayer structure may be defined as the restricting protrusion.

According to the configuration, the restricting portion can be easily formed by simultaneously forming the restricting line with the electrically conductive line in a forming process of the electrically conductive line and covered with the cover film.

In the configuration, the flexible printed circuit board may include a body and a layering portion. The body may include the electrically conductive line. The layering portion may be over the circuit board body. The overlaid portion may be defined as the restricting protrusion.

According to the configuration, the restricting portion can be easily formed by stacking the layering portion on the body.

In the configuration, the electronic component may be a current limiter to restrict flow of an excessive current through the electrically conductive line.

According to the configuration, the excessive current is less likely to flow through the electrically conductive line.

In the configuration, the current limiter may be a chip fuse.

With melting of the chip fuse due to the excessive current, the excessive current is further less likely to flow through the electrically conductive line.

A battery wiring module described herein includes the flexible printed circuit board including the electronic component. The battery wiring module is installed on the vehicle.

According to the configuration, the flexible printed circuit board including the electronic component is suitably applied to the battery wiring module.

In the configuration, the electrically conductive line may be electrically connected to an electrode of an energy storage component in a battery module to detect a voltage of the energy storage component.

According to the configuration, the voltage of the energy storage component can be detected and thus charge and discharge characteristics of an energy storage module can be stabilized.

Detailed Description of the Embodiment

Examples of the technology described herein will be described with reference to the drawings. The present invention is not limited to the examples. Modifications within technical scope of the claimed invention and equivalents of the technical scope of the claimed invention are considered to be within the technical scope of the present invention.

First Embodiment

A first embodiment will be descried with reference to FIGS. 1 to 5. A flexible printed circuit board including a current limiter (hereinafter referred to as the current limiter included FPC) 1 according to this embodiment is a part used for a battery module 3 that is installed on a vehicle 2. The vehicle 2 may be an electric vehicle or a hybrid electric vehicle.

As illustrated in FIG. 1, the battery module 3 is disposed in the middle of the vehicle 2. A power control unit (PCU) 4 is disposed in a front portion of the vehicle 2. The battery module 3 and the PCU 4 are connected to each other with a wire harness 5. The battery module 3 includes multiple energy storage components 6. The energy storage components 6 may be secondary batteries such as nickel-hydride secondary batteries and lithium-ion secondary batteries or capacitors.

(Battery Module 3)

Figure 2:
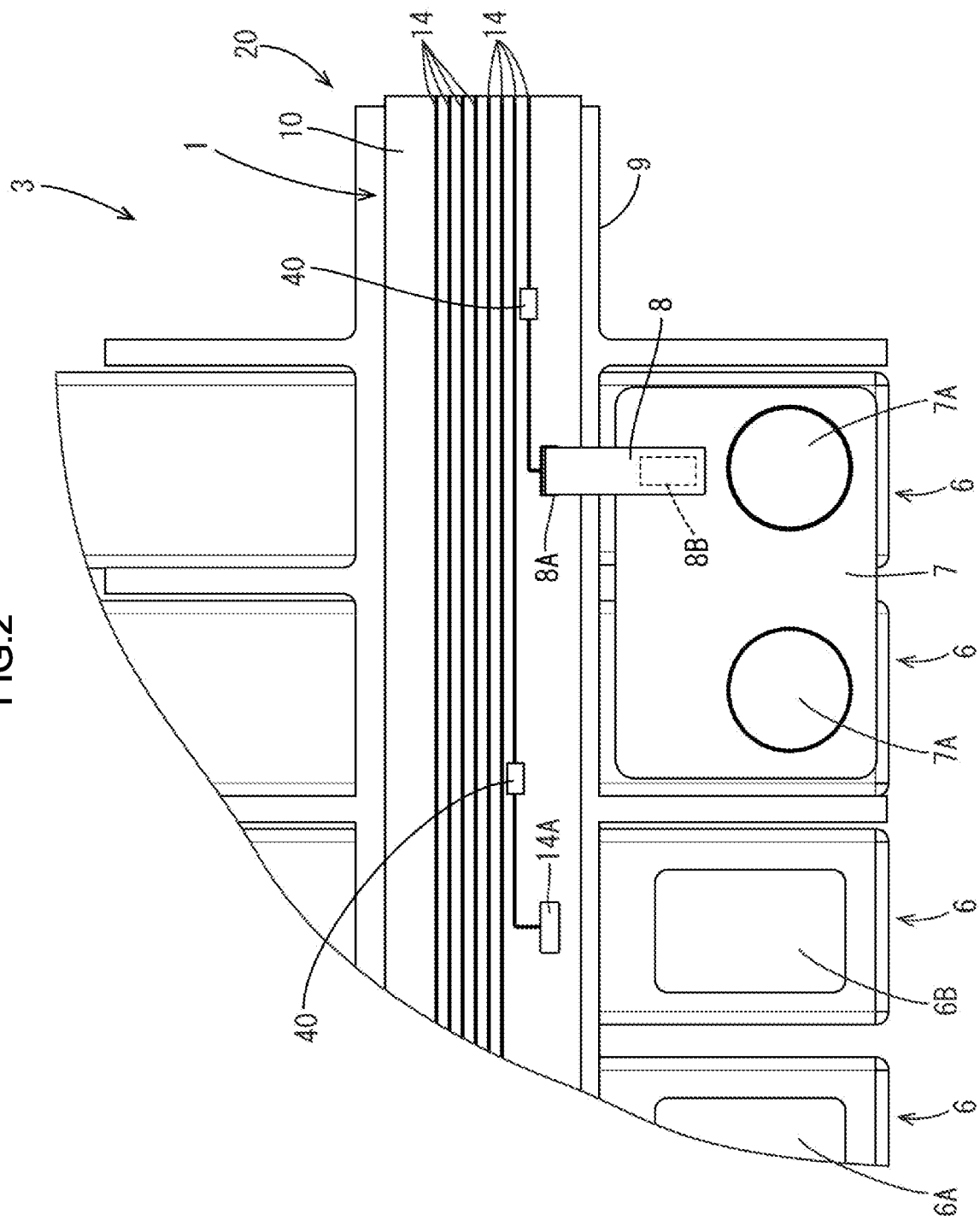
FIG. 2 is a partial plan view of a battery wiring module according to the first embodiment.

As illustrated in FIG. 2, each energy storage component 6 has a rectangular flat box shape. The energy storage components 6 hold an energy storage element (not shown) inside the energy storage components 6, respectively. The energy storage components 6 include electrodes 6A, 6B (illustrated as positive electrodes 6A, negative electrodes 6B) that protrude from top surfaces. In FIG. 2, the electrode 6A (6B) on one side in the top view of each energy storage component 6 is illustrated but the electrode 6B (6A) on the other side in the top view of the energy storage component 6 is not illustrated. The adjacent energy storage components 6 are oriented such that polarities of the adjacent electrodes 6A, 6B are opposite. Each of the electrodes 6A, 6B has a top surface that is a flat rectangular shape the electrode 6A (6B) at an end of the series connection is connected to an external device such as an inverter via an electric line, which is not illustrated.

(Battery Wiring Module 20)

As illustrated in FIG. 2, the battery wiring module 20 is attached to tops of the energy storage components 6. The battery wiring module 20 includes the current limiter included FPC 1, relay members 8, busbars 7, and an insulating protector 9. The relay members 8 are joined to the current limiter included FPC 1. The busbars 7 are joined to the relay members 8. Each busbar 7 electrically connects one of the electrodes 6A, 6B of the corresponding energy storage component 6 to another one of the electrodes 6A, 6B. The insulating protector 9 holds the current limiter included FPC 1 and the relay members 8.

(Busbar 7)

Each busbar 7 has a rectangular shape. The busbar 7 is formed from a metal plate made of copper, copper alloy, aluminum, aluminum alloy, stainless steel (SUS), or other metal. The busbar 7 has a sufficient size to cover two electrodes 6A, 6B that are adjacent to each other. The busbar 7 is fixed to the electrodes 6A, 6B by laser-welding. Welding portions 7A are formed in the busbar 7 after the laser-welding. Each welding portion 7A has a circular shape. In FIG. 2, one busbar 7 is illustrated. Other busbars 7 are not illustrated. With multiple busbars 7, any number of the energy storage components 6 can be connected in series or in parallel.

(Current Limiter Included FPC 1)

Figure 3:
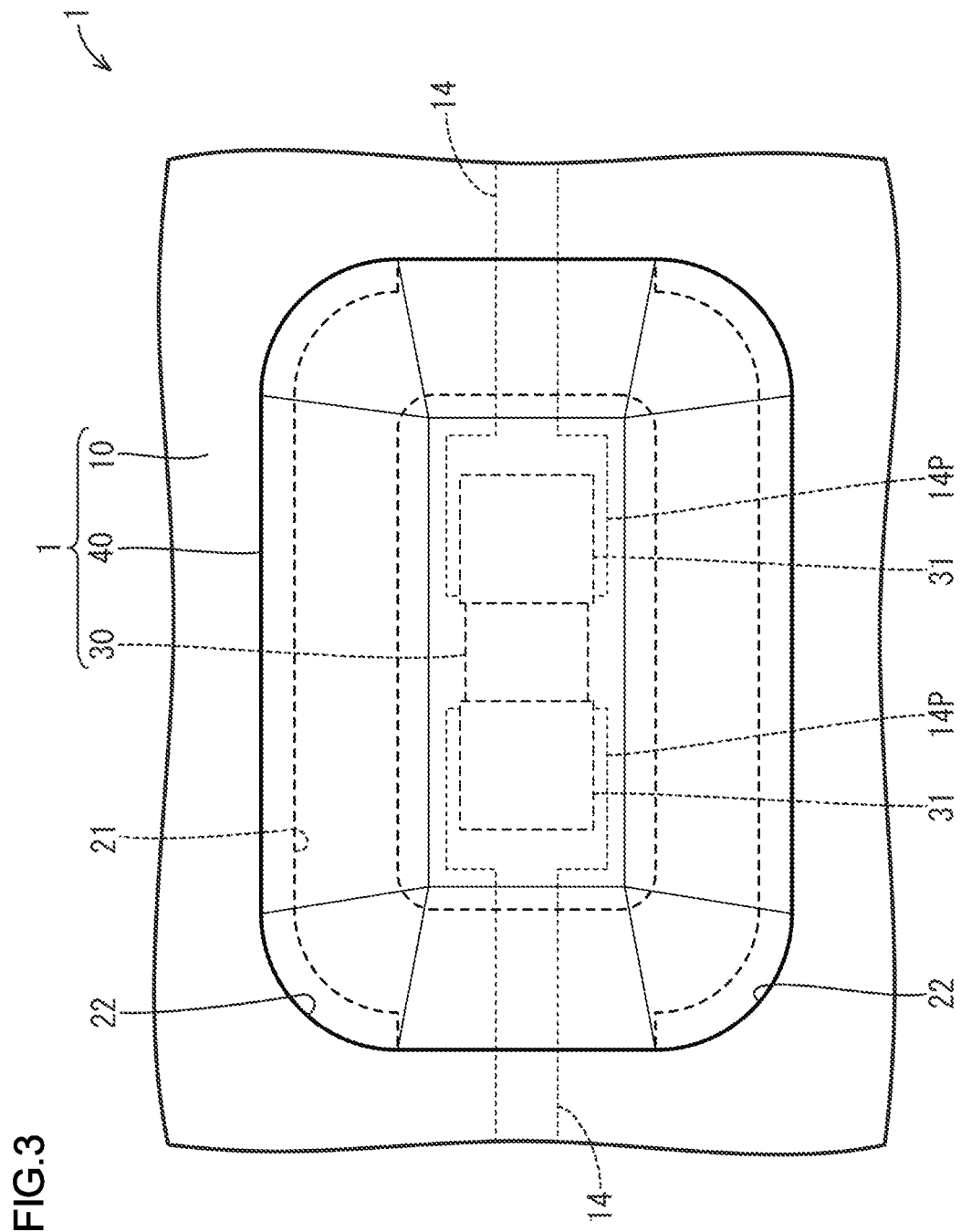
FIG. 3 is a partial magnified view of the FPC including the current limiter according to the first embodiment.
Figure 4:
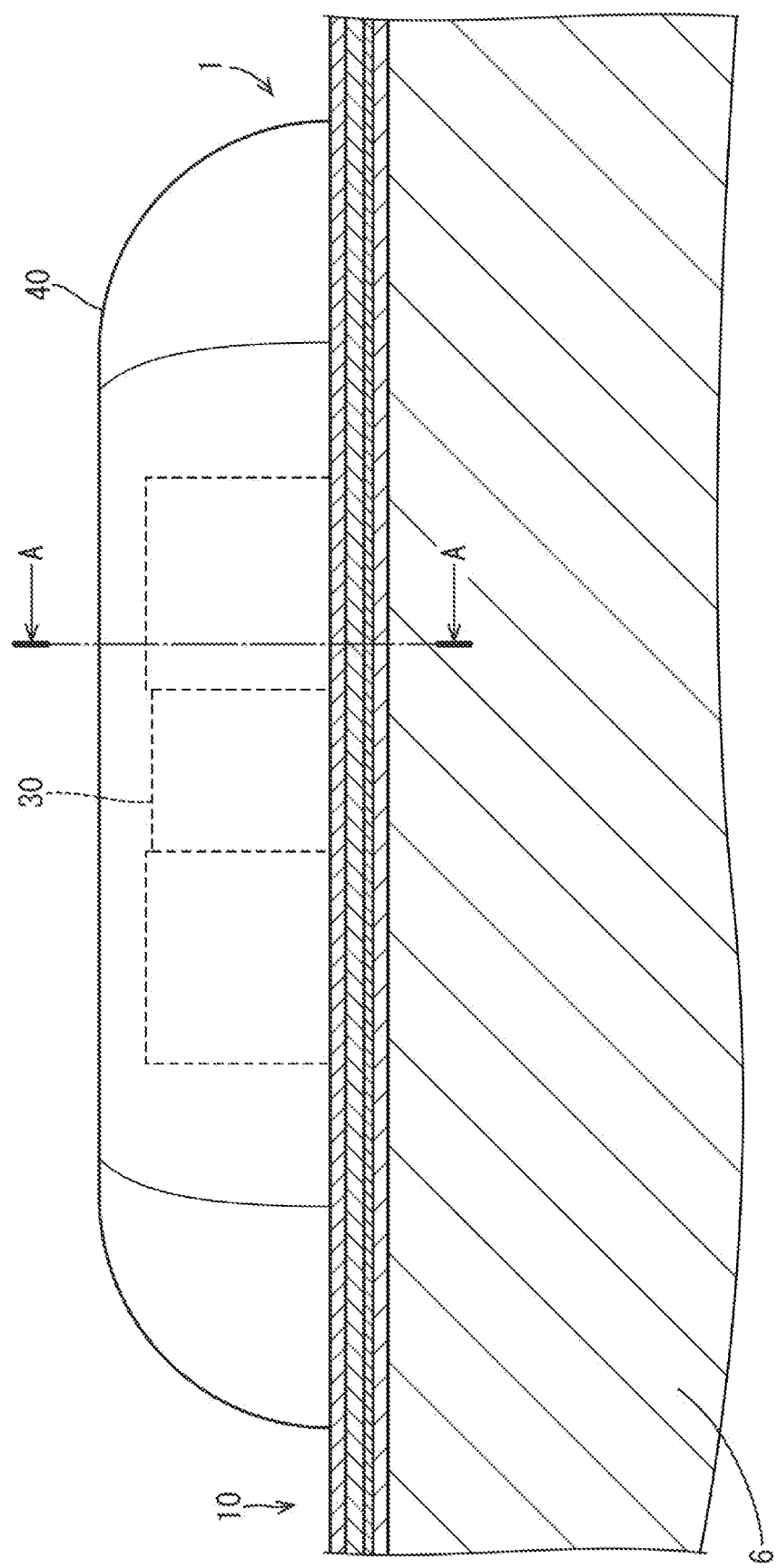
FIG. 4 is a partial magnified view of the FPC including the current limiter according to the first embodiment.

As illustrated in FIGS. 3 and 4, the current limiter included FPC 1 includes a flexible printed circuit board (FPC) 10, current limiters 30 (corresponding to an electronic component), and component covers 40 (corresponding to a cover). The current limiters 30 are mounted on the FPC 10. The component covers 40 have insulating properties and cover the current limiters 30, respectively.

Figure 5:
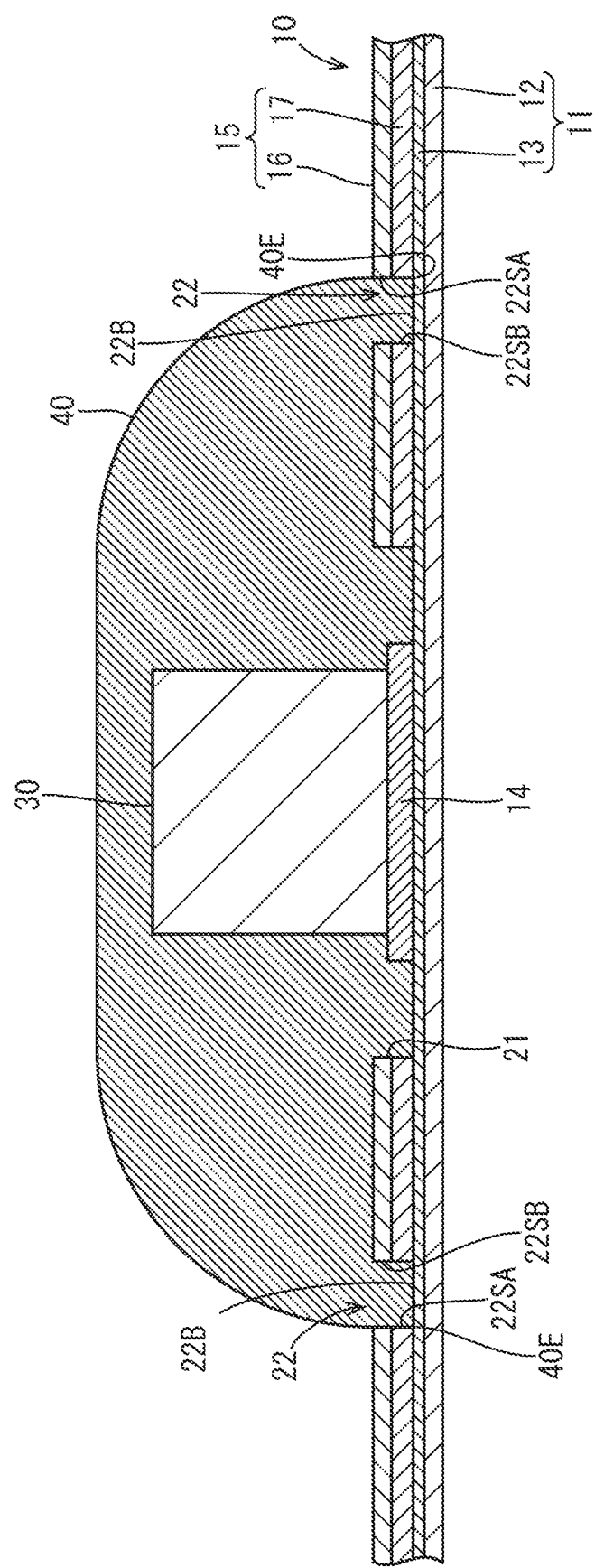
FIG. 5 is a cross-sectional view along line A-A in FIG. 4.

As illustrated in FIG. 5, the FPC 10 includes a base film 11, electrically conductive lines 14, and a cover film 15. The base film 11 has insulating properties. The electrically conductive lines 14 are disposed on one of surfaces of the base film 11. The cover film 15 has insulating properties and covers the electrically conductive lines 14. The electrically conductive lines 14 are arranged at intervals. The electrically conductive lines 14 extend in a longitudinal direction of the current limiter included FPC 1 to positions corresponding to the busbars 7. Ends of each electrically conductive lines 14 are bonded to lands 14A to which the relay members 8 can be soldered. Each land 14A has a rectangular shape. A section of each electrically conductive line 14 is exposed through a rectangular opening that is formed in the cover film 15, which will be described later, by removing a section of the cover film 15. An end of each electrically conductive line 14 on an opposite side from the land 14A is not illustrated; however, the end is electrically connected to an external electronic control unit. The electronic control unit includes a microcomputer and components. The electronic control unit has a known configuration to detect voltages, currents, and temperatures of the energy storage components 6 and to control charge and discharge of each energy storage component 6.

(Relay Member 8)

The relay members 8 electrically connect the busbars 7 to the lands 14A. Each relay member 8 may be formed from a metal plate made of copper, copper alloy, aluminum, aluminum alloy, stainless steel (SUS), nickel, nickel ally, or other metal. The relay member 8 is formed in a plate shape. The relay member 8 has an elongated rectangular shape when viewed from above. The relay members 8 include soldering portions 8A and welding portions 8B. The soldering portions 8A are soldered to the lands 14A. The welding portions 8B ae welded to the busbars 7. The soldering portions 8A and the welding portions 8B are at ends of the relay members 8 with respect to a longitudinal direction. The welding portions 8B are welded to the busbars 7 by a known method such as laser welding, resistance welding, and ultrasonic welding.

(Insulating Protector 9)

As illustrated in FIG. 2, the insulating protector 9 is made of synthetic resin having insulating properties. The insulating protector 9 has a plate shape. The current limiter included FPC 1 is placed on a top surface of the insulating protector 9. The current limiter included FPC 1 is fixed to the top surface of the insulating protector 9 by a known method such as adhesive bonding and welding.

(FPC 10)

As illustrated in FIG. 5, the base film 11 includes a base layer 12 and a base bonding layer 13. The base layer 12 is made of synthetic resin. The base bonding layer 13 is overlayed on the base layer 12. The electrically conductive lines 14 are formed in a predefined circuit pattern using a wire printing technology. As illustrated in FIG. 5, the electrically conductive lines 14 are disposed over the surface of the base film 11 on which the base bonding layer 13 is disposed. As illustrated in FIG. 5, the cover film 15 includes a cover layer 16 and a cover bonding layer 17. The cover layer 16 is made of synthetic resin. The cover bonding layer 17 is overlayed on the cover layer 16. A surface of the cover layer 16 on which the cover bonding layer 17 is disposed is opposite the base layer 12 and the electrically conductive lines 14.

As illustrated in FIGS. 3 and 5, the cover film 15 includes a hole 21 and two grooves 22 opposite each current limiter 30. A section of each electrically conductive line 14 is exposed through the hole 21. As illustrated in FIG. 3, the section of each electrically conductive line 14 includes two contact pads 14P that are joined to the current limiter 30. Two terminals 31 of the current limiter 30 are soldered to the contact pads 14P, respectively.

The current limiters 30 are configured to restrict flow of excessive currents through the corresponding electrically conductive lines 14 on the FPC 10. The current limiters 30 are not limited to any kind. The current limiters 30 may be chip fuses. If the chip fuses are used for the current limiters 30 and the excessive currents flow through the electrically conductive lines 14, the chip fuses melt and thus the excessive currents are less likely to flow.

As illustrated in FIG. 5, each of the grooves 22 is defined by a groove bottom surface 22B and groove side surfaces 22SA, 22SB. The groove bottom surface 22B is a section of the surface of the base film 11. The groove side surfaces 22SA, 22SB extend from the groove bottom surface 22B to the surface of the cover layer 16. Each groove 22 has a depth equal to a thickness of the cover film 15. A height of each the groove side surfaces 22SA, 22SB from the groove bottom surface 22B is equal to the thickness of the cover film 15. As illustrated in FIG. 3, each groove 22 extends in a U shape. The grooves 22 are opposite to each other and slightly separated from the hole edge of the hole 21. The grooves 22 surround the hole 21, the section of the electrically conductive line 14 exposed through the hole 21, and the current limiter 30. The grooves 22 are formed so that the grooves 22 do not reach the electrically conductive line 14. More specifically, as illustrated in FIG. 3, a first end of one of the grooves 22 and a first end of the other one of the grooves 22 are separated from each other and the electrically conductive line 14 joined to the contact pad 14P is disposed between the first ends. A second end of the one of the grooves 22 and a second end of the other one of the grooves 22 are separated from each other in the same manner.

The component covers 40 are made of synthetic resin. As illustrated in FIGS. 3 and 5, each component cover 40 covers the corresponding current limiter 30, the surface of the base film 11 exposed through the hole 21, and the section of the electrically conductive line 14. The component cover 40 has a dome shape. A section of the component cover 40 contacting the FPC 10 includes an outer edge 40E in a shape along the U shape of the grooves 22. As illustrated in FIG. 5, the outer edge 40E are mostly inside the grooves 22 except for sections in gaps between the ends of the grooves 22 and surrounded by outer side surfaces 22SA (corresponding to an inner wall, a restricting portion) among the groove side surfaces 22SA, 22SB on outer sides (ones farther from the other groove 22). Namely, the groove side surfaces 22SA are raised along the outer edge 40E of the component cover 40.

(Method of Producing the Current Limiter Included FPC1)

An example of a method of producing the current limiter included FPC 1 having the configuration described above will be described.

First, the FPC 10 is produced. A copper foil is placed over the base bonding layer 13 of the base film 11 and bonded. After an etching resist is applied to the copper foil, unnecessary sections of the copper foil are removed by etching. Then, the etching resist is removed. Through these steps, the electrically conductive lines 14 are formed. Next, the cover film 15 is placed over the base film 11 and the electrically conductive lines 14 formed on the base film 11. Then, the cover film 15 is bonded. The FPC 10 is prepared.

Next, the current limiters 30 are mounted on the FPC 10. Sections of the cover film 15 at which the holes 21 and the grooves 22 are formed are removed. The terminals 31 of the current limiters 30 are placed on the respective contact pads 14P that are exposed through the holes 21. Then, the terminals 31 are soldered to the respective contact pads 14P. Through these steps, mounting of the current limiters 30 on the FPC 10 is complete.

Next, the component covers 40 are formed. A potting material made of synthetic resin having flowability is delivered by drops on the FPC 10 through a nozzle to form the dome shapes. The potting material that spreads on the FPC 10 and flows into the grooves 22 is restricted by the groove side surfaces 22SA and thus restricted from farther spreading any farther. Therefore, droplets of the potting material is stably formed in proper shapes on the FPC 10. Each groove 22 has the depth equal to the thickness of the cover film 15. The height of each groove side surface 22SA is sufficient to stop the potting material. After the delivery is complete, the droplets of the potting material on the FPC 10 are hardened and the component covers 40 are formed.

(Effect)

In this embodiment, the current limiter included FPC 1 includes the FPC 10 that includes the electrically conductive lines 14, the current limiters 30 mounted on the FPC 10 and joined to the electrically conductive lines 14, and the component covers 40 that cover the joints between the current limiters 30 and the electrically conductive lines 14, as described above. The component covers 40 include the grooves 22 along the outer edges 40E of the component covers 40. The grooves 22 are defined by the groove side surfaces 22SA, 22SB. The groove side surfaces 22SA farther from the current limiters 30 among the groove side surfaces 22SA, 22SB are disposed along the outer edges 40E of the component covers 40 to surround the component covers 40. According to the configuration, during the forming of the component covers 40, the flow of the potting material is restricted by the groove side surfaces 22SA and thus the potting material is less likely to spread any farther. Because the outer edges 40E of the component covers 40 are defined by the groove side surfaces 22SA, the component covers 40 are stably shaped. Therefore, the protective effect of the insulating resin can be stably exerted.

Because the sections of the component covers 40 are in the grooves 22, the grooves 22 are filled with the sections of the component covers 40. According to the configuration, the insulating resin is more stably shaped.

The current limiter included FPC 1 according to this embodiment is attached to the battery module 3 that is installed on the vehicle 2. The vehicle 2 may be subjected to high humidity. In such a case, the current limiters 30 are protected from water droplets that are developed by condensation.

In this embodiment, the current limiters 30 are mounted on the FPC 10. The current limiters 30 restricts the flow of the excessive currents through the electrically conductive lines 14. With the current limiters 30, the excessive currents are less likely to flow through the electrically conductive lines 14.

When the excessive currents flow through the current limiters 30, the current limiters 30 generate heat. Because the current limiters 30 are covered with the component covers 40, the heat is transferred from the current limiters 30 to the component covers 40. According to this embodiment, the component covers 40 are stably shaped. Therefore, thermal capacities of the component covers 40 are stable. According to the configuration, the excessive current reducing effect of the current limiters 30 can be stably exerted.

The current limiters 30 in this embodiment include the chip fuses. The chip fuses melt due to the excessive currents. Therefore, the excessive currents are further less likely to flow through the electrically conductive lines 14.

The battery wiring module 20 in this embodiment includes the current limiter included FPC 1. The battery wiring module 20 is attached to the battery module 3 that is installed on the vehicle 2. The electrically conductive lines 14 on the current limiter included FPC 1 are electrically connected to the electrodes 6A, 6B of the energy storage components 6 included in the battery module 3 to detect the voltages of the energy storage components 6. According to the configuration, the voltages of the energy storage components 6 can be detected and thus the charge and discharge characteristics of the battery module 3 can be stabilized.

Second Embodiment

The second embodiment will be described with reference to FIGS. 6 and 7. A current limiter included FPC 50 in this embodiment is a part for the battery module 3, similar to the one in the first embodiment. The current limiter included FPC 50 includes multilayer structure portions 56 (corresponding to a restricting portion, a restricting protrusion), which are different from the first embodiment. The multilayer structures 56 protrude from a surface of a cover film 53 on an FPC 51 farther than other portions of the current limiter included FPC 50. Components and portions of this embodiment similar to those of the first embodiment will be indicated reference signs the same as the reference signs indicating the components in the first embodiment and will not be described.

Figure 6:
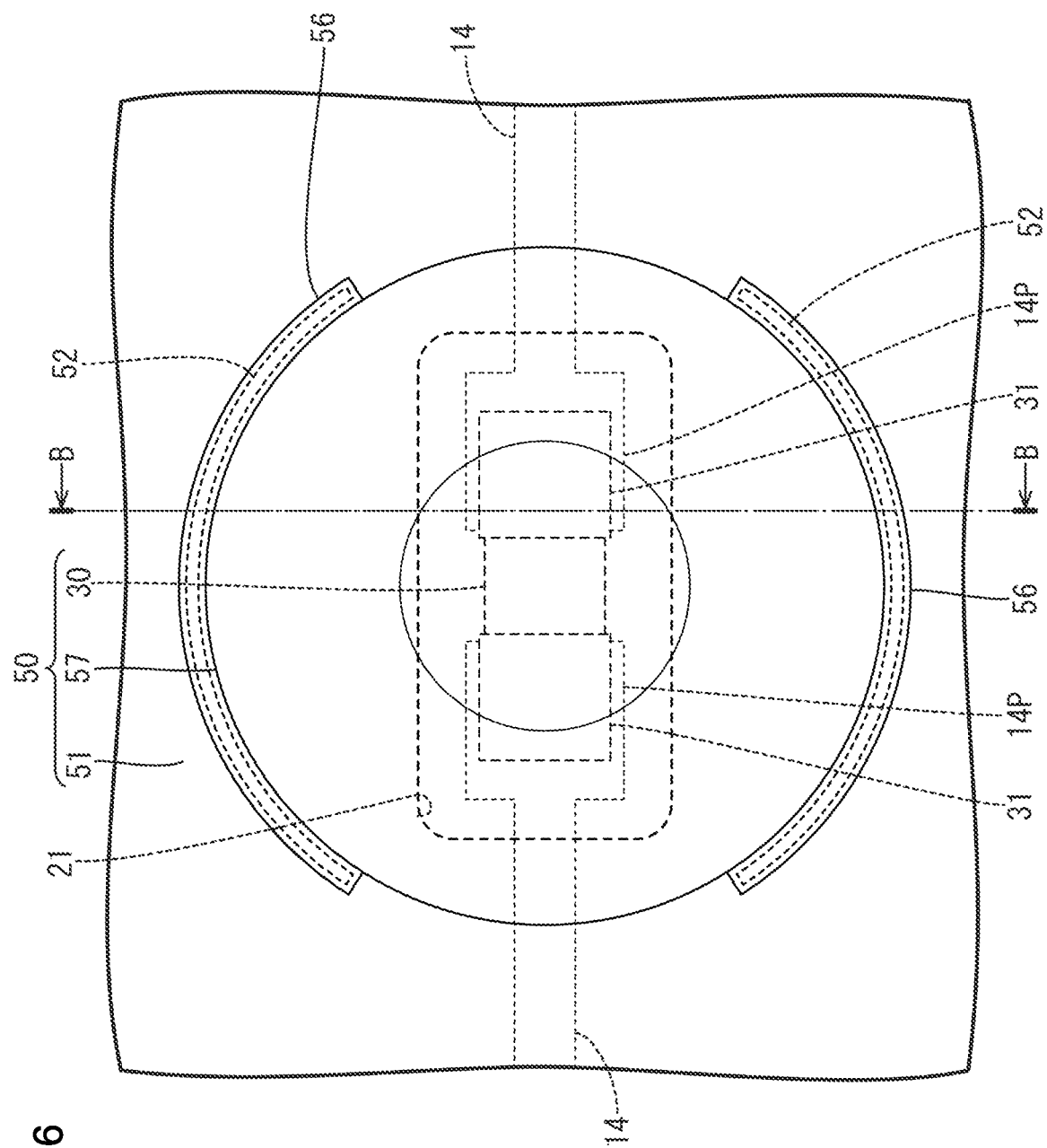
FIG. 6 is a partial magnified view of an FPC including a current limiter according to a second embodiment.

As illustrated in FIG. 6, the current limiter included FPC 50 includes the FPC 51, the current limiters 30, and component covers 57. The current limiters 30 are mounted on the FPC 51. The component overs 57 have insulating properties and cover the current limiters 30.

Figure 7:
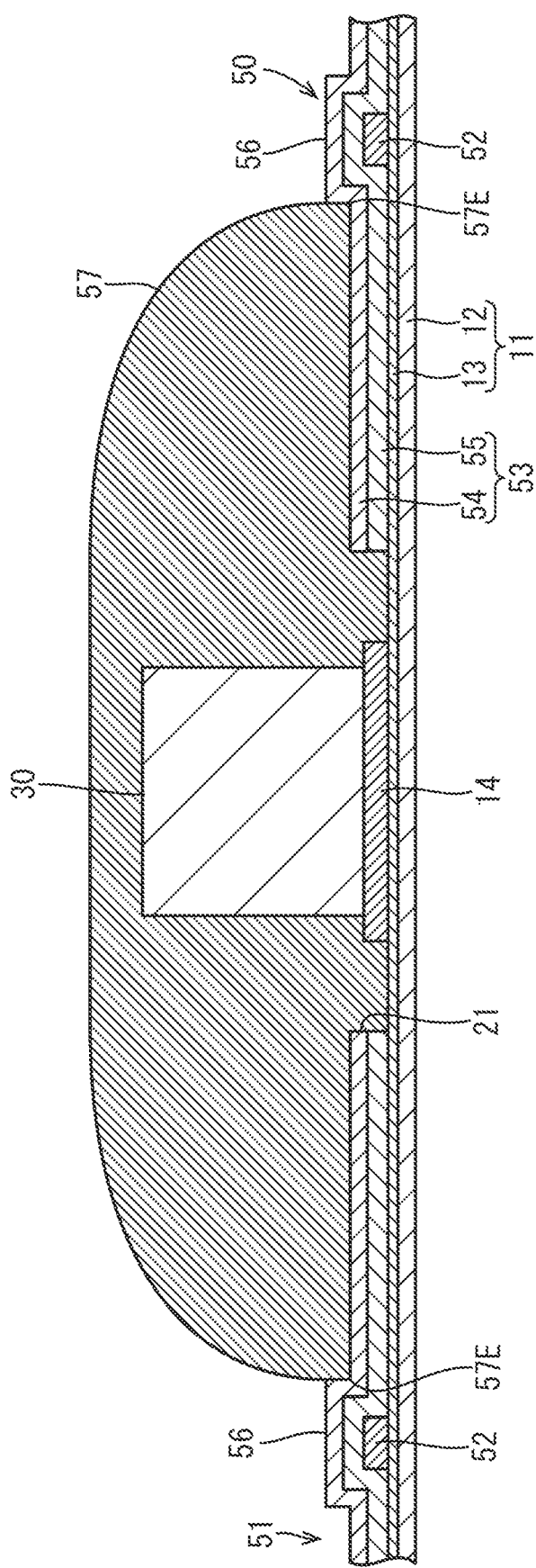
FIG. 7 is a cross-sectional view along line B-B in FIG. 6.

As illustrated in FIG. 7, the FPC 51 includes the base film 11, the electrically conductive lines 14, two restricting lines 52, and the cover film 53. The electrically conductive lines 14 and the restricting lines 52 are on a surface of the base film 11. The cover film 53 has insulating properties and covers the electrically conductive lines 14 and the restricting lines 52. The cover film 53 includes a cover layer 54 and a cover bonding layer 55, similar to the first embodiment. The cover layer 54 is made of synthetic resin. The cover bonding layer 55 is overlaid on the cover layer 54. A surface of the cover layer 54 on which the cover bonding layer 55 is disposed is opposite the base layer 12 and the electrically conductive lines 14. The cover film 53 does not include grooves, which is different from the first embodiment.

The restricting lines 52 are formed using the wire printing technology similarly to the electrically conductive lines 14. As illustrated in FIG. 6, the restricting lines 52 are line shaped portions that are curved in arc shapes. Two restricting lines 52 are opposite to each other with the current limiter 30 between the restricting lines 52. The restricting lines 52 do not reach the corresponding electrically conductive line 14. More specifically, a first end of one of the restricting lines 52 and a first end of the other one of the restricting lines 52 are separated from each other and the electrically conductive line 14 joined to the contact pad 14P is disposed between the first ends. A second end of the one of the restricting lines 52 and a second end of the other one of the restricting lines 52 are separated from each other in the same manner.

As illustrated in FIGS. 6 and 7, the cover film 53 includes portions that are over the restricting lines 52 and higher than other portions. The portions at two positions are defined as the multilayer structure portions 56. The multilayer structure portions 56 are extended in arc shapes. The multilayer structure portions 56 are slightly separated from the hole edge of the hole 21 and opposite to each other. The hole 21, a section of the electrically conductive line 14 exposed through the hole 21, and the current limiter 30 are surrounded by two multilayer structure portions 56. The ends of two restricting lines 52 are separated from each other by the gap and thus ends of two multilayer structure portions 56 are separated from each other by a gap.

The component covers 57 are made of synthetic resin. As illustrated in FIG. 7, the component covers 57 cover the current limiters 30, sections of the base film 11 exposed through the holes 21 and sections of the electrically conductive lines 14. Each component cover 57 has a dome shape. The component cover 57 is mostly surrounded by the multilayer structure portions 56 except for portions in the gaps between the ends of the multilayer structure portions 56. Portions of the component cover 57 contacting the FPC 51 include outer edges 57E. As illustrated in FIG. 7, the outer edges 57E abut on the multilayer structure portions 56 and have curved shapes along the curved shapes of the multilayer structure portions 56. Namely, the multilayer structure portions 56 are disposed along the outer edges 57E of the component cover 57.

(Method of Producing Current Limiter Included FPC 50)

Next, an example of a method of producing the current limiter included FPC 50 having the configuration described above will be described.

First, the FPC 51 is produced. A copper foil is placed over the base bonding layer 13 of the base film 11 and bonded. After an etching resist is applied to the copper foil, unnecessary sections of the copper foil are removed by etching. Then, the etching resist is removed. Through these steps, the electrically conductive lines 14 and the restricting lines 52 are formed. The cover film 53 is placed over the base film 11 and the electrically conductive lines 14 formed on the base film 11. Then, the cover film 53 is bonded. The portions of the cover film 53 over the restricting lines 52 are the multilayer structure portions 56 that are higher than other portions. The FPC 10 is prepared.

Next, the current limiters 30 are mounted on the FPC 51. Sections of the cover film 53 at which the holes 21 are formed are removed. The terminals 31 of the current limiters 30 are placed on the respective contact pads 14P that are exposed through the holes 21. Then, the terminals 31 are soldered to the respective contact pads 14P. Through these steps, mounting of the current limiters 30 on the FPC 51 is complete.

Next, the component covers 57 are formed. A potting material made of synthetic resin having flowability is delivered by drops on the FPC 51 through a nozzle to form the dome shapes. Dome-shaped droplets of the potting material are on the FPC 51. Spreading of the potting material on the FPC 51 is restricted by the multilayer structure portions 56 and thus the potting material is less likely to flow any farther. Therefore, thicknesses and areas of droplets of the potting material on the FPC 51 are substantially constant. After the delivery is complete, the droplets of the potting material are hardened and the component covers 57 are formed.

(Effect)

In this embodiment, the current limiter included FPC 50 includes the FPC 51, the current limiters 30, and the component covers 57 as described above. The FPC 51 includes the base film 11, the electrically conductive lines 14 and the restricting lines 52 that are on the base film 11, and the cover film 53 that covers the electrically conductive lines 14 and the restricting lines 52. The current limiters 30 are mounted on the FPC 51 and joined to the electrically conductive lines 14. The component covers 57 cover the joints between the current limiters 30 and the electrically conductive lines 14. The portions of the cover film 53 over the restricting lines 52 are defined as the multilayer structure portions 56 that are higher than the other portions. The multilayer structure portions 56 are the restricting protrusions that protrude from the surface of the FPC 51 farther than the other portions.

According to the configuration, during the forming of the component covers 57, the flow of the potting material is restricted by the multilayer structure portions 56 and thus the potting material is less likely to spread any farther. Because the outer edges 57E of the component covers 57 are defined by the multilayer structure portions 56, the component covers 57 are stably shaped. Therefore, the protective effect of the insulating resin can be stably exerted.

The restricting lines 52 may be formed simultaneously with the electrically conductive lines 14 in the forming process of the electrically conductive lines 14. By placing the cover film 53 over the restricting lines 52, the multilayer structure portions 56 can be easily formed.

Third Embodiment

A third embodiment will be described with reference to FIGS. 8 and 9. A current limiter included FPC 60 in this embodiment is a part used for the battery module 3, similar to the first embodiment. The current limiter included FPC 60 includes an FPC 61 that includes a body 62 and layering portions 66 (corresponding to a restricting portion, a restricting protrusion), which is different from the first embodiment. Components and portions of this embodiment similar to those of the first embodiment will be indicated reference signs the same as the reference signs indicating the components in the first embodiment and will not be described.

Figure 8:
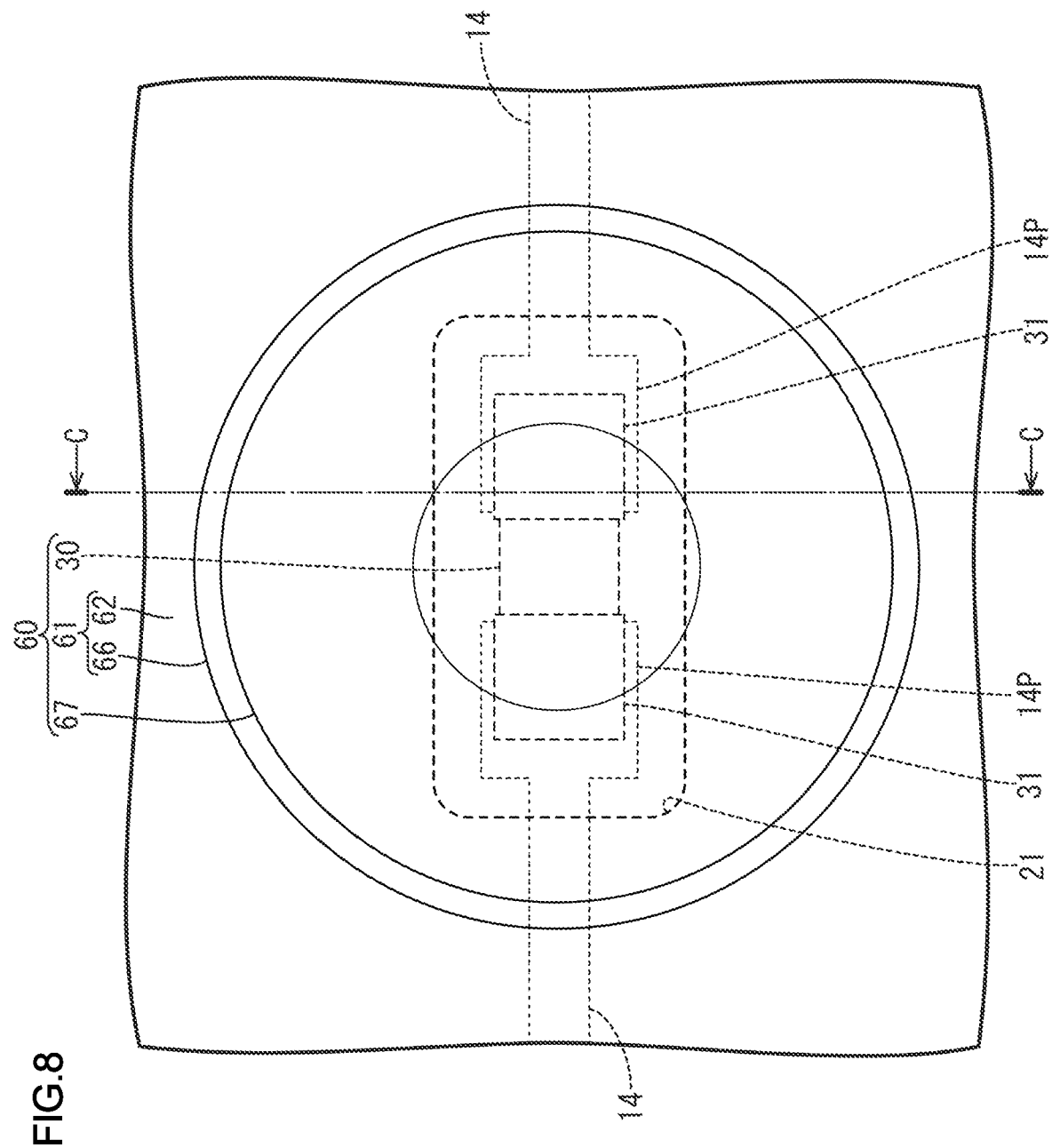
FIG. 8 is a partial magnified view of an FPC including a current limiter according to a third embodiment.

As illustrated in FIG. 8, the current limiter included FPC 60 includes the FPC 61, the current limiters 30 that are mounted on the FPC 61, and component covers 67 that cover the current limiters 30. The component covers 67 have insulating properties.

Figure 9:
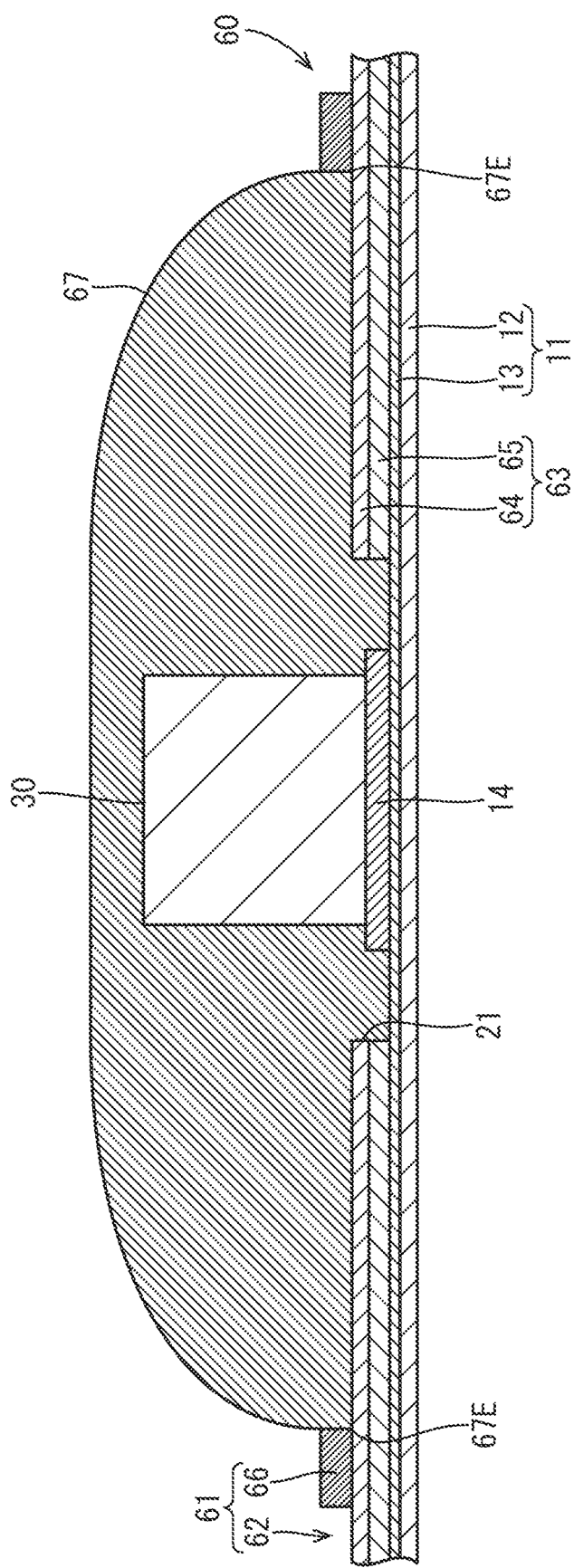
FIG. 9 is a cross-sectional view along line C-C in FIG. 8.

As illustrated in FIG. 9, the FPC 61 includes the body 62 and the layering portions 66. The body 62 includes the base film 11, the electrically conductive lines 14, and a cover film 63. The base film 11 has insulating properties. The electrically conductive lines 14 are on the surface of the base film 11. The cover film 63 has insulating properties and covers the electrically conductive lines 14. The layering portions 66 are over the cover film 63. The cover film 63 includes a cover layer 64 and a cover bonding layer 65, similar to the first embodiment. The cover layer 64 is made of synthetic resin. The cover bonding layer 65 is overlaid on the cover layer 64. A surface of the cover layer 64 on which the cover bonding layer 65 is overlaid is opposite the base layer 12 and the electrically conductive lines 14. The cover film 63 does not include grooves or multilayer structures, which is different from the first embodiment or the second embodiment.

As illustrated in FIG. 8, each layering portion 66 has an annular shape that is slightly greater than the hole edge of the corresponding hole 21. The layering portion 66 entirely surrounds the hole 21, a portion of the electrically conductive line 14 exposed through the hole 21, and the current limiter 30. The layering portions 66 are made of synthetic resin and disposed on a surface of the cover layer 64 of the cover film 63.

The component covers 67 are made of synthetic resin. As illustrated in FIG. 9, each component cover 67 covers the corresponding current limiter 30, a portion of the surface of the base film 11 exposed through the hole 21, and a portion of the corresponding electrically conductive line 14. The component cover 67 has a dome shape. As illustrated in FIGS. 8 and 9, the component cover 67 is surrounded by the corresponding layering portion 66 for the entire circumference. As illustrated in FIG. 9, a portion of the component cover 67 contacting the FPC 61 includes an outer edge 67E that abuts on the layering portion 66. The outer edge 67E has a shape along the annular shape of the layering portion 66. Namely, the layering portion 66 is disposed along the outer edge 67E of the component cover 67.

(Method of Producing Current Limiter Included FPC 60)

Next, an example of a method of producing the current limiter included FPC 60 having the configuration described above will be described.

First, the body 62 is produced. A copper foil is placed over the base bonding layer 13 of the base film 11 and bonded. After an etching resist is applied to the copper foil, unnecessary sections of the copper foil are removed by etching. Then, the etching resist is removed. Through these steps, the electrically conductive lines 14 are formed. The cover film 63 is placed over the base film 11 and the electrically conductive lines 14 formed on the base film 11. Then, the cover film 63 is bonded. The body 62 is prepared.

Next, the layering portions 66 are mounted on the cover film 63 and the FPC 61 is prepared.

Next, the current limiters 30 are mounted on the FPC 61. Sections of the cover film 63 at which the holes 21 are formed are removed. The terminals 31 of the current limiters 30 are placed on the respective contact pads 14P that are exposed through the holes 21. Then, the terminals 31 are soldered to the respective contact pads 14P. Through these steps, mounting of the current limiters 30 on the FPC 61 is complete.

Next, the component covers 67 are formed. A potting material made of synthetic resin having flowability is delivered by drops on the FPC 61 through a nozzle to form the dome shapes. Dome-shaped droplets of the potting material are on the FPC 61. Spreading of the potting material on the FPC 61 is restricted by the layering portions 66 and thus the potting material is less likely to flow any farther. Therefore, thicknesses and areas of droplets of the potting material on the FPC 61 are substantially constant. After the delivery is complete, the droplets of the potting material are hardened and the component covers 67 are formed.

(Effect)

In this embodiment, the current limiter included FPC 60 includes the FPC 61, the current limiters 30, and the component covers 67 as described above. The current limiters 30 are mounted on the FPC 61 and connected to the electrically conductive lines 14. The component covers 67 cover the joints between the current limiters 30 and the electrically conductive lines 14. The FPC 61 includes the body 62 and the layering portions 66. The body 62 includes the electrically conductive lines 14. The layering portions 66 are over the body 62. The layering portions 66 are the restricting protrusions that protrude from the surface of the FPC 61 farther than the other portions.

According to the configuration, during the forming of the component covers 67, the flow of the potting material is restricted by the layering portions 66 and thus the potting material is less likely to spread any farther. Because the outer edges 67E of the component covers 67 are defined by the layering portion 66, the component covers 67 are stably shaped. Therefore, the current limiters 30 can stably deliver proper performance.

The layering portions 66 are easily formed on the surface of the body 62 using a printing technology such as screen printing.

Because the layering portions 66 are separated from the electrically conductive lines 14 by the cover film 63, each layering portion 66 can be provided for the entire circumference of the component cover 67.

Other Embodiments (1) The electronic components mounted on the flexible printed circuit board are not limited to the current limiters.

(2) The shapes of the restricting portions are not limited to the U shape, the arc shape, and the annular shape. The restricting portions may have any shapes. For example, the restricting portions may have rectangular frame shapes.

(3) The restricting portion along the outer edge of the corresponding component cover may not extend for the entire circumference. The number of the multilayer structures used for the restricting portions is not limited to two. Three or more multilayer structures may be used for the restricting portions.

(4) The installing location of the battery module on the vehicle is not limited. The battery module may be installed in any portion of the vehicle such as the front portion and the rear portion of the vehicle.

EXPLANATION OF SYMBOLS 1, 50, 60: Current limiter included FPC (Flexible printed circuit board including an electronic component)
2: Vehicle
3: Battery module
4: Power control unit (PCU)
5: Wire harness
6: Energy storage component
6A, 6B: Electrode
7: Busbar
7A: Welding portion
8: Relay member
8A: Soldering portion
8B: Welding portion
9: Insulating protector
10, 51, 61: Flexible printed circuit board (FPC)
11: Base film
12: Base layer
13: Base bonding layer
14: Electrically conductive line
14P: Contact pad
15, 53, 63: Cover film
16, 54, 64: Cover layer
17, 55, 65: Cover bonding layer
20: Battery wiring module 21: Hole
22: Groove
22B: Groove bottom surface
22SA: Groove side surface (Inner wall, Restricting portion)
22SB: Groove side surface
30: Current limiter (Electronic component)
31: Terminal
40, 57, 67: Component cover (Cover)
40E, 57E, 67E: Outer edge
52: Restricting line
56: Multilayer structure portion (Restricting portion, Restricting protrusion)
66: Multilayer structure portion (Restricting portion, Restricting protrusion)

The invention claimed is:

1. A vehicular battery wiring module to be attached to a battery module installed on a vehicle, the vehicular battery wiring module comprising:
   a flexible printed circuit board including a base film, an electrically conductive line disposed on the base film, a cover film having an insulating property and covering the electrically conductive line, and a restricting portion;
   a current limiter being mounted on the flexible printed circuit board to restrict flow of an excessive current through the electrically conductive line and including two terminals; and
   a cover covering the current limiter, wherein
   the electrically conductive line includes two contact pads,
   the cover film includes a hole through which the contact pads are exposed,
   the terminals of the current limiter are joined to the contact pads,
   the cover covers a joint between the terminals of the current limiter and the contact pads,
   the restricting portion extends along an outer edge of the cover,
   the restricting portion is configured to restrict a flow of resin that forms the cover,
   the restricting portion includes a groove defined by a first groove side surface and a second groove side surface that are opposed to each other,
   the first groove side surface is farther from the current limiter, and
   the groove is separated from a hole edge of the hole.

2. The vehicular battery wiring module according to claim 1, wherein the cover includes a section disposed in the groove.

3. A vehicular battery wiring module to be attached to a battery module installed on a vehicle, the vehicular battery wiring module comprising:
   a flexible printed circuit board including a base film, an electrically conductive line disposed on the base film, a cover film having an insulating property and covering the electrically conductive line, and a restricting portion;
   a current limiter being mounted on the printed circuit board to restrict flow of an excessive current through the electrically conductive line and including two terminals; and
   a cover covering the current limiter, wherein
   the electrically conductive line includes two contact pads,
   the cover film includes a hole through which the contact pads are exposed,
   the terminals of the current limiter are joined to the contact pads,
   the cover covers a joint between the terminals of the current limiter and the contact pads,
   the restricting portion extends along an outer edge of the cover,
   the restricting portion is configured to restrict a flow of resin that forms the cover,
   the restricting portion protrudes from a surface of the flexible printed circuit board farther than other portions of the flexible printed circuit board,
   the restricting portion includes a restricting line disposed on the base film and covered with the cover film,
   the restricting line is separated from a hole edge of the hole,
   the restricting line is disposed not to reach the electrically conductive line,
   the cover film includes a section bonded to the restricting line to form a multilayer portion of the flexible printed circuit board, and
   the multilayer portion of the flexible printed circuit board is higher than other portions of the flexible printed circuit board.

4. The vehicular battery wiring module according to claim 1, wherein the current limiter includes a chip fuse.

5. The vehicular battery wiring module according to claim 1, wherein the electrically conductive line is electrically connected to an electrode of an energy storage component included in the battery module to detect a voltage of the energy storage component.

6. The vehicular battery wiring module according to claim 3, wherein the current limiter includes a chip fuse.

7. The vehicular battery wiring module according to claim 3, wherein the electrically conductive line is electrically connected to an electrode of an energy storage component included in the battery module to detect a voltage of the energy storage component.

* * * * *